US007635392B2

(12) United States Patent
Bloess et al.

(10) Patent No.: US 7,635,392 B2
(45) Date of Patent: Dec. 22, 2009

(54) SCANNING PROBE MICROSCOPY CANTILEVER, CORRESPONDING MANUFACTURING METHOD, SCANNING PROBE MICROSCOPE, AND SCANNING METHOD

(75) Inventors: Harald Bloess, Radebeul (DE); Andreas Heidelberg, Dresden (DE); Jens-Hendrik Zollondz, Dresden (DE)

(73) Assignee: Qimonda AG, Munich (DE)

( * ) Notice: Subject to any disclaimer, the term of this patent is extended or adjusted under 35 U.S.C. 154(b) by 295 days.

(21) Appl. No.: 11/891,881

(22) Filed: Aug. 14, 2007

(65) Prior Publication Data

US 2009/0045336 A1 Feb. 19, 2009

(51) Int. Cl.
G01N 13/10 (2006.01)
(52) U.S. Cl. ................. 850/56; 850/29; 850/40; 850/55; 850/57; 850/60; 250/306; 250/307
(58) Field of Classification Search .......... 850/29, 850/40, 55, 56, 57, 60, 61
See application file for complete search history.

(56) References Cited

U.S. PATENT DOCUMENTS 7,405,089 B2 * 7/2008 Bloess et al. ................ 438/14

7,553,335 B2 * 6/2009 Tanda et al. ................. 850/59
2007/0167814 A1 * 7/2007 Wakabayashi et al. ...... 600/459
2009/0106869 A1 * 4/2009 Park et al. ................... 850/60

FOREIGN PATENT DOCUMENTS

JP          2005207957          *  8/2005

* cited by examiner

Primary Examiner—David A Vanore
(74) Attorney, Agent, or Firm—Fay Kaplun & Marcin, LLP

(57) ABSTRACT

The present invention provides a scanning probe microscope cantilever comprising a support portion, a lever portion extended from the support portion, and a needle projecting out of a first surface of the cantilever in the vicinity of a free end of the lever portion. From a second surface of the cantilever opposite the first surface, a bore extends through the needle to an aperture formed at a tip of the needle. To the tip of the needle, a substantially globular particle is attached. A method of scanning a sample surface comprises creating relative cantilever motion substantially toward the sample such that the particle experiences a contact force with the sample, illuminating a top surface of the cantilever with laser light such that a portion of the laser light passes through the hollow needle and is emitted from the aperture onto the particle, and detecting scattered light from the sample.

37 Claims, 3 Drawing Sheets

SCANNING PROBE MICROSCOPY CANTILEVER, CORRESPONDING MANUFACTURING METHOD, SCANNING PROBE MICROSCOPE, AND SCANNING METHOD

BACKGROUND OF THE INVENTION

1. Field of the Invention

The present invention relates to a scanning probe microscopy cantilever, and furthermore to a scanning probe microscope including such a cantilever as well as methods for manufacturing the cantilever and for scanning a sample by making use of the cantilever.

2. Description of the Related Art

Although in principle applicable to arbitrary scanning probe microscopy investigations, the invention and its background will be explained with respect to investigations of semiconductor surfaces by tip-enhanced Raman spectroscopy (TERS). TERS is a relatively new technique for investigating sample surfaces that is based on a combination of scanning probe microscopy (SPM) and Raman spectroscopy. A sharp tip such as used in SPM is brought into close distance to or actual contact with a sample surface to be investigated, thereby forming a cavity between the end of the tip and the sample. An excitation laser is then focused onto the end of the sharp tip, illuminating the cavity with light of a wavelength that is longer than the dimensions of the cavity. Localized surface plasmons are excited in the apex of the tip and/or in the cavity, leading to a magnification of electromagnetic fields within the cavity, and in consequence to an intensely magnified Raman scattering signal that can be detected to obtain information about properties of the sample in the confined region pointed at by the tip.

The ability to obtain highly localized information e.g. about the chemical composition or local stress of the sample at a given location makes TERS useful in semiconductor development and manufacturing. However, adjustment of the tip and the laser beam relative to each other require careful calibration before TERS measurements can be performed, which makes it time-consuming and expensive to routinely employ TERS e.g. in semiconductor development or even production. Furthermore, in particular the investigation of high-aspect-ratio structures common in semiconductor manufacturing is made difficult since the shape of the tip, its orientation, as well as the direction of the laser beam have to be coordinated in order to enable both the laser light and the tip to reach the bottom of such structures.

BRIEF SUMMARY OF THE INVENTION

Various aspects of the invention are listed in independent claims 1, 7, 14, 18, and 23, respectively.

Further aspects are listed in the respective dependent claims.

DESCRIPTION OF THE DRAWINGS

In the FIGS..

In the FIGS., like numerals refer to the same or similar functionality throughout the several views.

DETAILED DESCRIPTION

Figure 1:
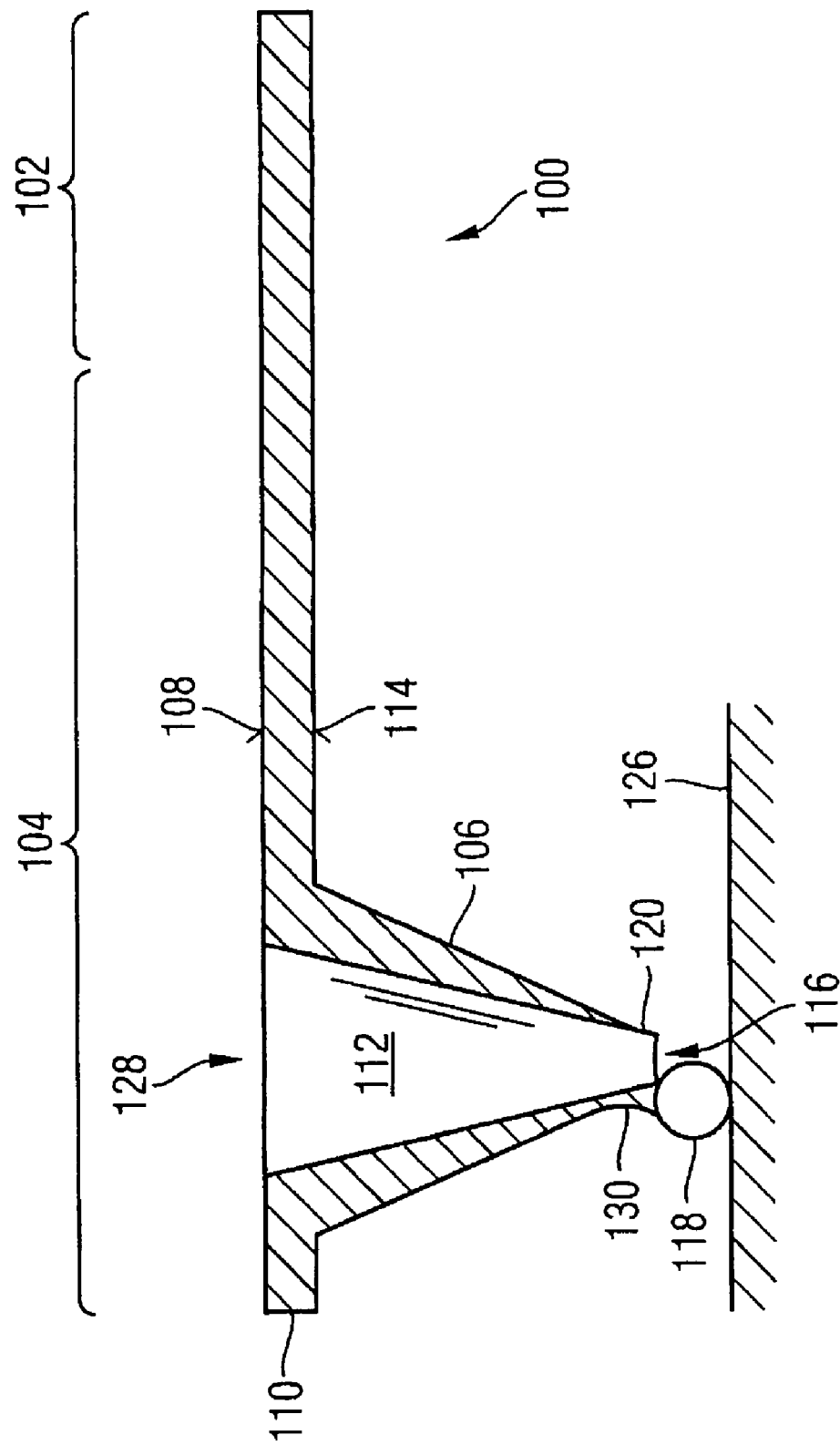
FIG. 1 shows a schematic section of a scanning probe microscopy cantilever according to an embodiment of the invention, positioned above a sample to be scanned.

FIG. 1 illustrates a cantilever 100 for use as a probe in scanning probe microscopy according to a first embodiment of the present invention. The cantilever 100 comprises a support portion 102 for mounting the cantilever 100 within a scanning probe microscope above a sample 126 to be investigated, oriented such that a lever portion 104 extends from the support portion 102 substantially in parallel to the sample surface 126. The lever portion 104 ends in a free end 110 and is formed from an elastic material such that it moves upwards and downwards due to its elasticity when a corresponding force is applied to the lever portion 104 close to its free end 110. For example, the lever portion 104 may be formed of a slab of silicon, and may optionally be formed integrally with the support portion 102 of a single slab, as shown in the present embodiment.

Close to the free end 110 of the lever portion 104, a hollow needle 106 of near-conical shape extends downwards from the bottom surface 114 of the cantilever 100, i.e. from a first surface 114 of the cantilever 100 that is oriented towards the sample 126. In the interior 112 of the hollow needle 106, a bore 112 is formed that extends from the tip 120 at the lower end 120 of the needle 106 throughout the entire length of the needle 106 and furthermore through the lever portion 104 of the cantilever 100 to its top surface 108, i.e. to a second surface 108 of the cantilever 100 opposite the first surface 114. In other words, the bore 112 connects an aperture 116 formed at the tip 120 of the needle 106 with a corresponding opening 128 at the top surface 108 of the cantilever 100. The opening 128 is centered substantially vertically above the aperture 116. The opening 128 is of a greater diameter than the aperture 116, the bore 112 connecting the opening 128 and the aperture 116 being near-conically shaped with the thickness of the outer wall of the hollow needle decreasing towards the lower end of the needle 106. The hollow needle 106 may be formed integrally with the lever portion 104 and furthermore with the support portion 102, e.g. from a single slab of silicon and may be manufactured by conventional ion bombardment or etching techniques.

At the tip 120 of the hollow needle 106 a near-globular particle 118 is attached to the rim of the aperture 116, in such a way that a portion of it is positioned below the aperture 116, the projections of the particle 118 and of the aperture 116 onto the sample surface 126 respectively overlapping each other partially. The diameter of the particle 118 is of approximately the same size, i.e. of the same order of magnitude as the diameter of the aperture 116. The particle 118 may be formed of or coated with any kind of material, e.g. at least one metal such as gold, silver, copper, ruthenium, rhodium, palladium, osmium, iridium, or platinum. When manufacturing the cantilever 100, the particle 118 may be picked up and provisionally held by electrostatic attraction between the needle 106 tip 120 and the particle 118, by applying suitable electrostatic potentials to the particle 118 and/or the remaining parts 102, 104, 106 of the cantilever 100. Then, the particle may be permanently attached to the rim of the aperture 120 by e.g. applying a high-energy beam such as an ion beam, laser beam, electron beam or high-density plasma to the junction 130 of the particle 118 and the needle 106, or by applying an electric current pulse between the particle 118 and/or the remaining parts 102, 104, 106 of the cantilever 100.

The embodiment shown enables to direct light onto the sample surface 126 to be investigated e.g. by directing a laser beam through the hollow needle 106, such that a portion of the light is emitted from the aperture 116 at its lower end, without e.g. being overshadowed by a high-aspect-ratio structure of the sample surface 126 or by the needle 106 itself.

Furthermore, since the needle 106 projects out of the first surface 114 of the cantilever 100, the bore 112 extending from the second surface 108 opposite the first surface of the cantilever 100 into the needle 106, the embodiment enables to direct e.g. laser light onto the second surface 108 of the cantilever 100, such that a portion of the laser light that does not enter the bore 112 but rather impinges on portions of the second surface 108 surrounding the bore 112 is overshadowed by the cantilever 100 and thus prevented from reaching the sample 126. An embodiment of this kind enables to restrict the light reaching the sample surface 126 to those portions of the light that pass through the needle's 106 aperture 116. In this way, only a region of the sample 126 in the immediate vicinity of the aperture 116 is illuminated such that selectivity is enhanced, without need for precise adjustment of the laser beam relative to the position of the needle tip 120.

Furthermore, since the substantially globular particle 118 is attached to the tip 120 of the needle 106, the embodiment enables to enhance the electromagnetic field of the light emitted from the aperture by forming a cavity between the particle 118 and the sample 126 and generating surface plasmon resonances in the cavity and/or a surface of the particle 118 itself. Consequently, an enhanced Raman signal is enabled to be obtained.

Figure 2:
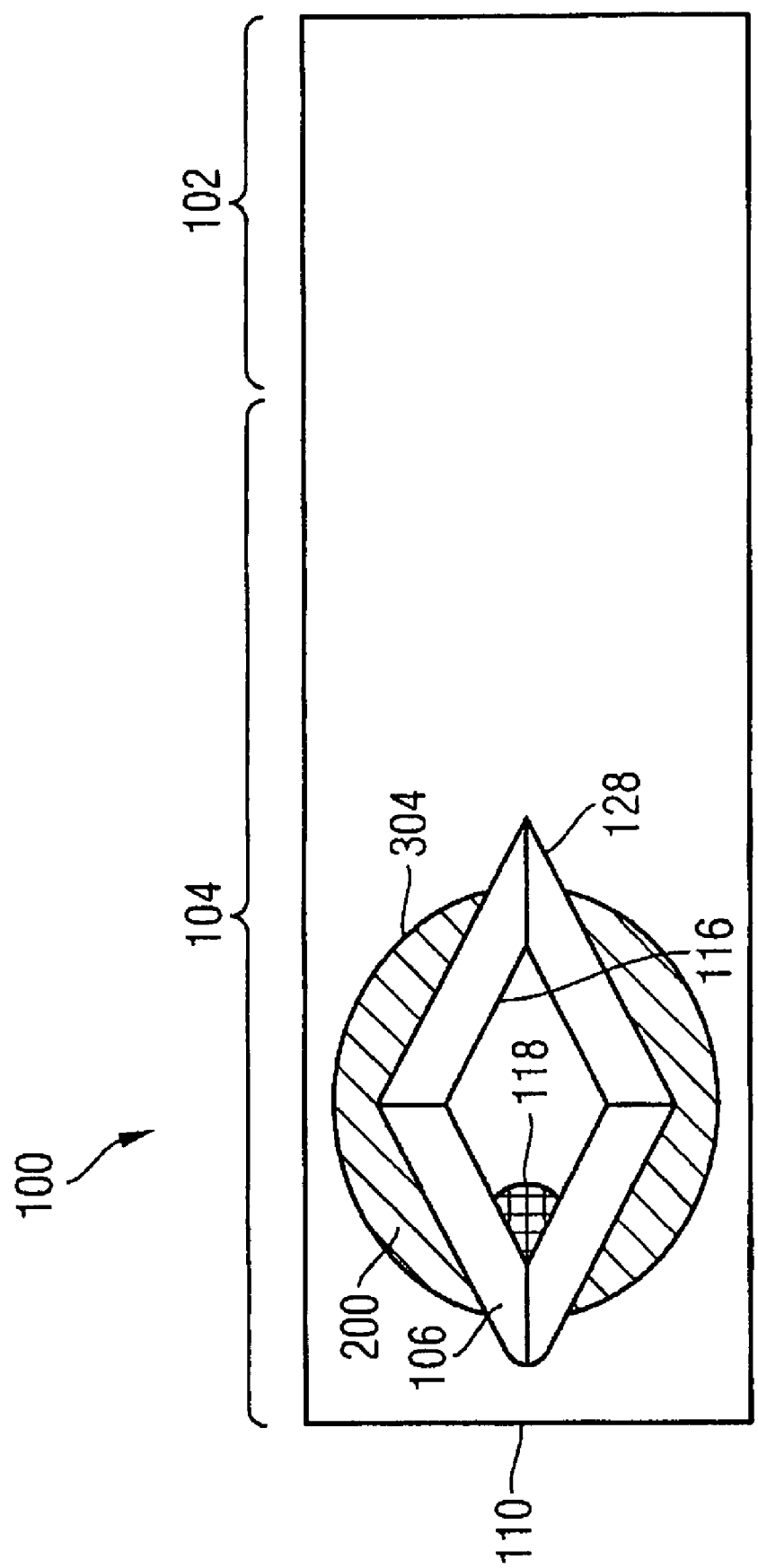
FIG. 2 shows a schematic top view of a cantilever according to an embodiment of the present invention.

FIG. 2 shows a schematic top view of a cantilever 100 according to an embodiment of the present invention, corresponding to a view onto the second surface 108 in FIG. 1 in the direction of the sample 126 in FIG. 1. Close to the free end 110 of the cantilever opposite of the support portion 102, an opening 128 is formed in the top surface of the lever portion 104 of the cantilever. The opening 128 is shown to comprise a near-rhombic cross section. From the opening 128 downwards, the interior walls 106 of a hollow needle 106 extend down to an aperture 116 at the lower end of the needle 106. The aperture is also shown to comprise a near-rhombic cross section of smaller size than the size of the opening 128, positioned below the opening 128, such that the bore of the needle 106 comprises a near-frustro-pyramidal shape. In alternative embodiments, the opening 128 and/or the aperture 116 may be shaped differently, e.g. be of approximately circular shape, enclosing between them a bore of near-frustro-conical shape.

Below the aperture 116 at the lower end of the needle 106, a portion of a near-globular particle 118 attached to the tip of the needle 106 is visible. The particle 118 is of a size comparable to the size of the aperture 116 and is positioned relative to the aperture 116 such that its projection onto the drawing plane of FIG. 2 partially overlaps with the cross-section of the aperture 116.

Overlapping with the opening 128, the border of a light spot 304 to be illuminated by a laser beam 304 during operation of the cantilever 100 is marked. The laser light is directed to the drawing plane from above, down to the aperture 116. Thus, the shape of the light spot 304 corresponds to the cross-section 304 of the laser beam 304 as it impinges onto the top surface of the cantilever 100. Portions of the laser light 304 reach the plane of the top surface of the cantilever 100 within the boundaries of the opening 128 are transmitted downwards and emitted from the aperture 116 at the tip of the needle 106, where they impinge either on the particle 118 or on the sample surface in the vicinity of the particle. Shadowed portions 200 of the laser beam 304 are absorbed and/or reflected back by the top surface of the cantilever 100 and thus prevented from reaching the sample surface. Since in the present embodiment the lateral dimensions of the cantilever 100 have been chosen to be wider than the cross-section 304 of the laser beam 304, the portions of the laser light 304 that reach the particle 118 and/or the sample surface are precisely focused to a narrow region aligned with the position of the particle 118 on the sample surface, without requiring the laser beam 304 to be aligned with like precision.

Figure 3:
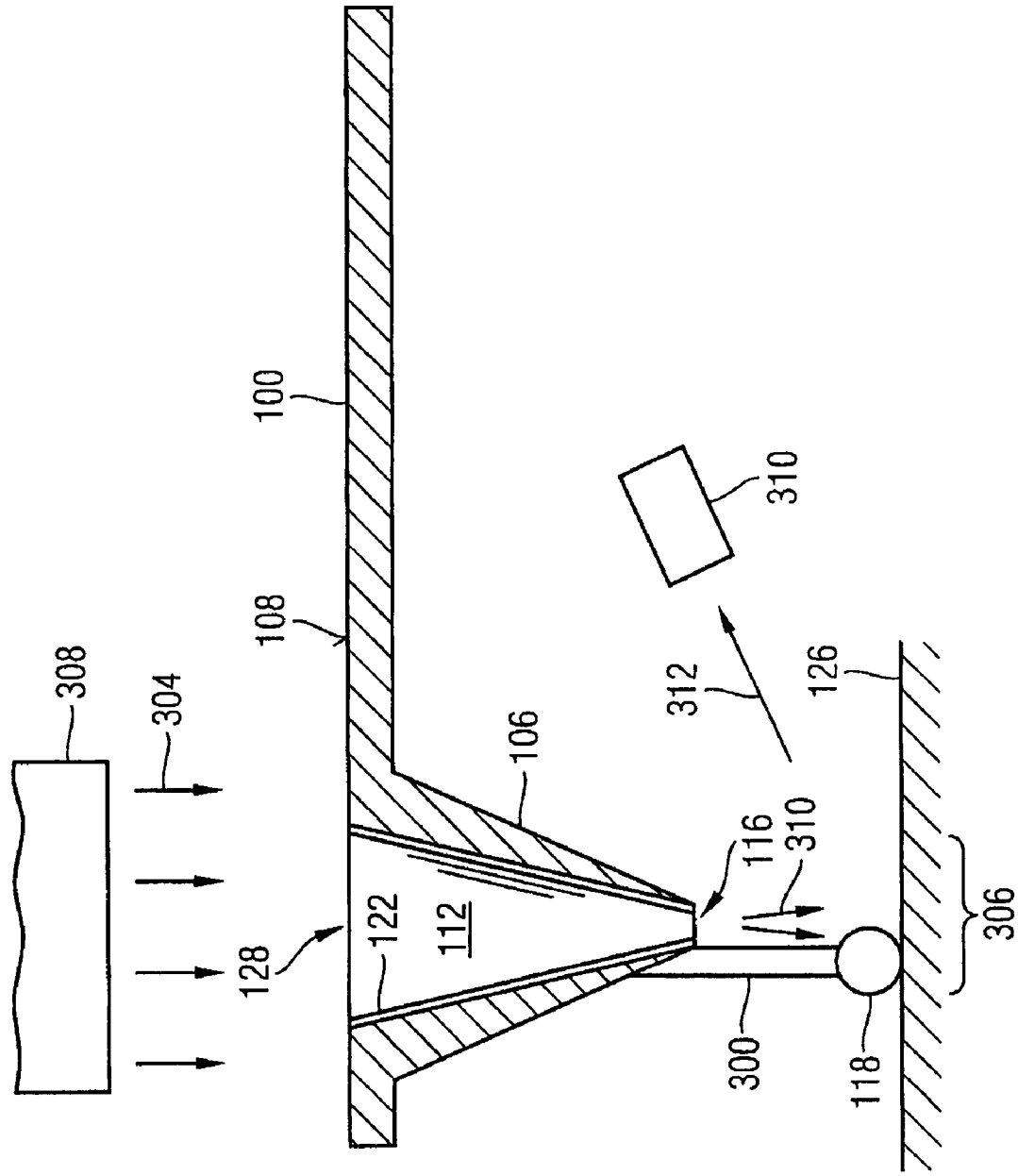
FIG. 3 shows a schematic section of a scanning probe microscopy cantilever according to a further embodiment of the invention, in use with a scanning probe microscope and positioned above a sample to be scanned.

FIG. 3 shows a schematic section of a scanning probe microscopy cantilever 100 according to a further embodiment of the invention, in use with a scanning probe microscope and positioned above a sample 126 to be scanned. The shape and dimensions of the hollow needle 106 projecting out of the cantilever 100 towards the sample 126 as well as those of the particle 118 are chosen as in the embodiment of FIG. 1. However, the interior of the bore 112 is shown to be optionally coated by a reflective coating 122 such as aluminum. Furthermore, the particle 118 has been attached to the rim of the aperture 116 at the tip of the needle 106 by means of a stem 300 made of nanotube 300 projecting from the rim of the aperture 116 downwards to the sample 126 and attached with its lower end to the particle 118. The present embodiment enables the particle to be lowered into trenches and other structures of high aspect ratio that are narrower than the needle 106, thereby enabling e.g. the local strain of silicon to be determined at the bottom of such structures. In different embodiments, different respective lengths of the stem 300 may be chosen, e.g. any length between 0 nm and 400 nm, corresponding to the shape of the structures to be investigated.

When manufacturing the cantilever 100 of the present embodiment, the stem 300 may be grown from the material of the needle 106 itself, e.g. when the needle 106 is formed of silicon, as described for the embodiment of FIG. 1. Alternatively, the stem 300 may be grown or formed from a different material such as carbon, a metal or a semiconductor material that is supplied separately, e.g. by using molecular-beam epitaxy or any other method being able to grow nanotubes.

In a first step of an embodiment of the manufacturing process, the particle 118 is picked up by the needle 106 and provisionally held in place e.g. by electrostatic adhesion or surface tension. The junction between the particle 118 and the needle 106 is then irradiated by a high-energy beam, causing a nanotube or nanowire to form at the junction, the particle acting as a catalyst. In alternative embodiments of the manufacturing method, the stem 300 is grown or formed on the needle first, and the particle picked up and attached to the terminal end of the stem 300 in a subsequent step.

In operation, the cantilever 100 is placed as a probe inside a scanning probe microscope and positioned above the sample 126 to be investigated. The cantilever is moved toward the sample 126 until the particle 118 is in contact with or within a close distance to the sample surface 126. Depending on the type of scanning probe microscope, the particle 118 is moved towards the sample 126 e.g. until it experiences a contact force that causes a deflection of the cantilever 100, or until a tunneling current of a predetermined strength between the sample 126 and the particle 118 is reached.

The top surface 108 of the cantilever 100 is then illuminated by laser light 304 from a laser 308 installed in the scanning probe microscope, such that a first portion of the laser light 304 enters the bore 112 through the opening 128 in the top surface while a second portion of the laser light 304 impinges on the top surface 108. After entering the bore 112, the first portion of the laser light 304 is guided by the bore 112 through the hollow needle 106 and emitted at the tip of the needle 106 from the aperture 116. The laser light 310 emitted from the aperture 116 impinges on the particle 118 and on the sample surface 126 within a confined region 306 in the immediate vicinity of the particle. Plasmon and phonon resonances are generated on the surface of the particle 118 and in the cavity formed by the underside of the particle 118 and the sample surface 126 that lead to a localized enhancement of the electromagnetic fields. This in turn leads to an enhanced Raman scattering signal 312 from the confined area 306, which is detected by a detector 310.

In alternative embodiments, different dimensions of the particle 118 may be chosen, e.g. corresponding to respective wavelengths of the laser light 304 employed in such a way that particularly strong plasmon resonances and consequently particularly strong Raman signals are generated. For example, a diameter of the particle 118 may be chosen between 20 nm and 200 nm, corresponding to laser wavelengths, the diameter of the particle 118 being approximately one third of the wavelength of the laser light 304.

What is claimed is:

1. A scanning probe microscope cantilever, comprising:
   a support portion;
   a lever portion extended from the support portion;
   a needle projecting out of a first surface of the cantilever in the vicinity of a free end of the lever portion, a bore extending from a second surface of the cantilever opposite the first surface through the needle to an aperture formed at a tip of the needle; and
   a substantially globular particle attached adjacent to the aperture to the tip of the needle.

2. The cantilever of claim 1, wherein the particle comprises a metal.

3. The cantilever of claim 2, wherein the metal comprises at least one of gold, silver, copper, ruthenium, rhodium, palladium, osmium, iridium, and platinum.

4. The cantilever of claim 1, further comprising a stem connecting the particle to the needle, the stem comprising a smaller diameter than the particle.

5. The cantilever of claim 4, wherein the stem comprises a nanotube.

6. The cantilever of claim 5, wherein the nanotube comprises at least one of carbon and silicon.

7. The cantilever of claim 1, wherein the particle comprises a diameter up to 500 nm.

8. The cantilever of claim 1, wherein the bore comprises an interior coating.

9. The cantilever of claim 8, the coating comprising aluminum.

10. A scanning probe microscope, comprising:
    a cantilever for scanning over a sample;
    a hollow needle projecting out of a lower surface of the cantilever, a bore extending from an opening in a top surface of the cantilever through the cantilever and through the needle to an aperture formed at a lower end of the needle; and
    a substantially globular particle attached to a rim of the aperture.

11. The scanning probe microscope of claim 10, wherein the particle comprises a metal.

12. The scanning probe microscope of claim 11, wherein the metal comprises at least one of gold, silver, copper, ruthenium, rhodium, palladium, osmium, iridium, and platinum.

13. The scanning probe microscope of claim 10, further comprising a laser configured to illuminate the opening in the top surface of the cantilever such that light is emitted from the aperture at the lower end of the needle.

14. The scanning probe microscope of claim 10, wherein the particle comprises a diameter of less than a wavelength of the emitted light.

15. The scanning probe microscope of claim 14, wherein the particle comprises a diameter between one fourth and one half of the wavelength of the emitted light.

16. The scanning probe microscope of claim 10, wherein the particle is positioned to receive a portion of the laser light emitted from the aperture.

17. The scanning probe microscope of claim 10, further comprising a stem connecting the particle to the rim of the aperture, the stem comprising a nanotube.

18. The scanning probe microscope of claim 17, wherein the nanotube comprises at least one of carbon and silicon.

19. The scanning probe microscope of claim 10, further comprising means for detecting light scattered from the sample.

20. A scanning probe microscopy sensor, comprising:
    a cantilever for scanning over a sample;
    a hollow needle projecting out of a lower surface of the cantilever, a bore extending from an opening in a top surface of the cantilever to an aperture formed at a lower end of the hollow needle; and
    means for fixing a substantially globular particle in a relative position to the lower end of the hollow needle.

21. The scanning probe microscopy sensor of claim 20, the means for fixing being adapted to fix the particle in a position substantially at the same height as the lower end of the hollow needle.

22. The scanning probe microscopy sensor of claim 20, the means for fixing being adapted to fix the particle in a distanced position below the lower end of the hollow needle.

23. The scanning probe microscopy sensor of claim 20, the means for fixing being adapted to fix the particle in a position out of a central axis of the hollow needle by a diameter of the particle or less.

24. The scanning probe microscopy sensor of claim 20, further comprising the particle, fixed in the relative position to the lower end of the hollow needle.

25. The scanning probe microscopy sensor of claim 24, the particle comprising a metal.

26. The scanning probe microscopy sensor of claim 25, the metal comprising at least one of gold, silver, copper, ruthenium, rhodium, palladium, osmium, iridium, and platinum.

27. A method of manufacturing a scanning probe microscopy cantilever for scanning over a sample, the method comprising the steps:
    forming a hollow needle projecting out of a bottom surface of the cantilever, a bore extending from an opening in a top surface of the cantilever to an aperture formed at a lower end of the hollow needle; and
    attaching a substantially globular particle adjacent to the aperture to the tip of the needle.

28. The method of manufacturing a scanning probe microscopy cantilever of claim 27, further comprising a step of forming a stem that connects the particle to the needle, the stem comprising a smaller diameter than the particle.

29. The method of manufacturing a scanning probe microscopy cantilever of claim 28, wherein the step of forming the stem comprises:
    providing a base material for forming the stem at the tip of the needle; and
    irradiating a high-energy beam onto the tip of the needle.

30. The method of manufacturing a scanning probe microscopy cantilever of claim 29, wherein the base material comprises at least one of carbon, silicon, a carbon compound, or a silicon compound.

31. The method of manufacturing a scanning probe microscopy cantilever of claim 29, wherein the step of forming the stem is performed after the step of attaching the particle to the needle, by irradiating the high-energy beam onto a junction between the needle and the particle.

32. The method of manufacturing a scanning probe microscopy cantilever of claim 28, wherein the step of forming the stem is performed before the step of attaching the particle, the particle being attached to a terminal end of the stem.

33. A method of scanning a sample using a probe microscope, the probe microscope comprising a cantilever for scanning over a sample, a hollow needle projecting out of a bottom surface of the cantilever, the method comprising the steps:

attaching a substantially globular particle adjacent to an aperture at the tip of the hollow needle;

creating relative cantilever motion substantially toward the sample such that the particle experiences a contact force with the sample;

illuminating a top surface of the cantilever with laser light such that a first portion of the laser light passes through a bore in the cantilever into the hollow needle, the first portion being emitted from the aperture onto the particle; and detecting scattered light from the sample.

34. The method of scanning a sample of claim 33, wherein a second portion of the laser light is emitted from the aperture onto the sample within a spot in the vicinity of the particle.

35. The method of scanning a sample of claim 34, wherein the spot comprises a diameter equal to or less than a diameter of the particle.

36. The method of scanning a sample of claim 33, further comprising:

creating a relative cantilever motion substantially parallel to a surface of the sample; and adjusting a relative distance between the cantilever and the sample such that the contact force is held substantially constant.

37. The method of scanning a sample of claim 33, wherein the step of creating the relative cantilever motion substantially toward the sample comprises:

mounting the cantilever onto a tuning fork; and oscillating the tuning fork such that the cantilever performs an oscillating motion substantially toward and away from the sample.

* * * * *